(12) United States Patent
Lee et al.

(10) Patent No.: US 11,422,167 B2
(45) Date of Patent: Aug. 23, 2022

(54) INTEGRATED CURRENT SENSOR WITH MAGNETIC FLUX CONCENTRATORS

(71) Applicant: TEXAS INSTRUMENTS INCORPORATED, Dallas, TX (US)

(72) Inventors: Dok Won Lee, Mountain View, CA (US); Jo Bito, Dallas, TX (US); Keith Ryan Green, Prosper, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 34 days.

(21) Appl. No.: 16/932,299

(22) Filed: Jul. 17, 2020

(65) Prior Publication Data

US 2022/0018879 A1 Jan. 20, 2022

(51) Int. Cl.
| | | |
|---|---|---|
| *G01R 15/20* | (2006.01) | |
| *H01L 43/06* | (2006.01) | |
| *H01L 23/495* | (2006.01) | |
| *H01L 43/04* | (2006.01) | |
| *H01L 27/22* | (2006.01) | |

(52) U.S. Cl.
CPC ......... *G01R 15/207* (2013.01); *G01R 15/202* (2013.01); *H01L 23/49586* (2013.01); *H01L 43/04* (2013.01); *H01L 43/06* (2013.01); *H01L 27/22* (2013.01)

(58) Field of Classification Search
CPC ............... G01R 15/207; G01R 15/202; H01L 23/49586; H01L 43/04
See application file for complete search history.

(56) References Cited

U.S. PATENT DOCUMENTS

| | | | | |
|---|---|---|---|---|
| 7,358,724 | B2* | 4/2008 | Taylor | G01R 15/207 324/260 |
| 2010/0072992 | A1* | 3/2010 | Bauer | B82Y 25/00 324/260 |
| 2010/0188078 | A1* | 7/2010 | Foletto | G01R 33/0023 324/251 |
| 2013/0015839 | A1* | 1/2013 | Franke | G01R 33/0011 324/117 H |
| 2016/0282388 | A1* | 9/2016 | Milano | H01L 21/4828 |
| 2017/0184636 | A1* | 6/2017 | Racz | H01L 43/06 |
| 2020/0041310 | A1* | 2/2020 | Lassalle-Balier | G01D 5/16 |

OTHER PUBLICATIONS

Allegro Microsystems. High Accuracy, Galvanically Isolated Current Sensor IC with Small Footprint SOIC8 Package. ACS722-DS, Rev. 5. Sep. 3, 2019, pp. 1-23.
Melexis. "MLX91208 IMC-Hall® Current Sensor (Triaxis® Technology)." Jun. 2018, pp. 1-20.

* cited by examiner

*Primary Examiner* — Dominic E Hawkins
(74) *Attorney, Agent, or Firm* — Ming Wai Choy; Charles A. Brill; Frank D. Cimino

(57) ABSTRACT

A packaged current sensor includes a lead frame, an integrated circuit, an isolation spacer, a first magnetic concentrator, and a second magnetic concentrator. The lead frame includes a conductor. The isolation spacer is between the lead frame and the integrated circuit. The first magnetic concentrator is aligned with the conductor. The second magnetic concentrator is aligned with the conductor.

32 Claims, 4 Drawing Sheets

INTEGRATED CURRENT SENSOR WITH MAGNETIC FLUX CONCENTRATORS

BACKGROUND

Contactless current sensing is employed in a variety of applications for safely measuring current flow, particularly for nigh current levels. Open-loop current sensing provides a cost-effective solution in which a magnetic field generated by the flow of current through an electrical conductor is concentrated inside a magnetic core, and a magnetic sensor measures the field and provides an output signal used for estimating the current flow. Open-loop approaches typically consume little power, and can use low sensitivity sensors for measuring high currents.

SUMMARY

In a current sensor that provides high voltage isolation and immunity from stray magnetic fields, a packaged current sensor includes a lead frame, an integrated circuit, an isolation spacer, a first magnetic concentrator, and a second magnetic concentrator. The lead frame includes a conductor. The isolation spacer is between the lead frame and the integrated circuit. The first magnetic concentrator is aligned with the conductor. The second magnetic concentrator is aligned with the conductor.

In another example, a current sensor includes a lead frame, an integrated circuit, an isolation spacer, a first magnetic concentrator, and a second magnetic concentrator. The lead frame includes a conductor. The conductor includes a current input segment, and a current output segment. The integrated circuit includes a Hall effect sensor. The isolation spacer is between the lead frame and the integrated circuit. The first magnetic concentrator is aligned with the current input segment and overlaps the Hall effect sensor. The second magnetic concentrator is aligned with the current output segment.

In a further example, a current sensor includes a lead frame, a first magnetic concentrator, a second magnetic concentrator, an integrated circuit, and an isolation spacer. The lead frame includes a conductor. The conductor includes a current input segment, and a current output segment. The integrated circuit includes a first Hall effect sensor, a second Hall effect sensor, a third Hall effect sensor, and a fourth Hall effect sensor. The isolation spacer is between the lead frame and the integrated circuit. The first magnetic concentrator is formed as a metal layer on the integrated circuit, and overlaps the current input segment, the first Hall effect sensor, and the second Hall effect sensor. The second magnetic concentrator is formed as a metal layer on the integrated circuit, and overlaps the current output segment, the third Hall effect sensor, and the fourth Hall effect sensor.

DETAILED DESCRIPTION

The shortcomings of packaged current sensing circuits include limited voltage isolation between an integrated circuit (including a Hall effect sensor and/or other circuitry) and a current carrying conductor, and susceptibility to errors caused by a stray magnetic field. The current sensors described herein include high-voltage isolation that protects the integrated circuit. Some implementations of the current sensors also include an arrangement of magnetic concentrators and Hall effect sensors that provide immunity from errors due to stray magnetic fields.

Figure 1:
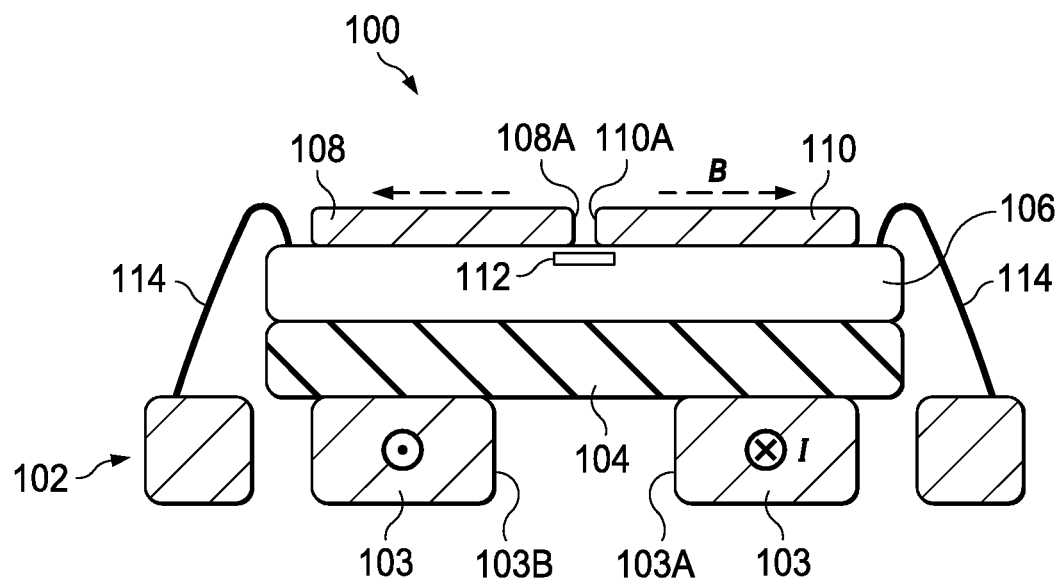
FIG. 1 shows a side view of a current sensor that includes a Hall effect sensor overlapping two magnetic concentrators.

FIG. 1 shows a side view of a current sensor 100 in accordance with this description. The current sensor 100 includes a lead frame 102, an isolation spacer 104, an integrated circuit 106, a magnetic concentrator 108, and a magnetic concentrator 110. The lead frame 102 includes a conductor 103 that carries a current to be measured. The conductor 103 includes a current input leg/segment 103A through which current flows in to the current sensor 100 and a current output leg/segment 103B through which current flows out of the current sensor 100. The isolation spacer 104 is disposed between the lead frame 102 and the integrated circuit 106 to isolate the integrated circuit 106 from high voltages that may be present on the conductor 103. The isolation spacer 104 is formed of material having high dielectric strength, such as glass dielectric materials, polymer-based dielectric materials, or silicon-based dielectric materials. In some implementations of the current sensor 100, the isolation spacer 104 has a thickness of about 100-150 micrometers (um).

The integrated circuit 106 is a silicon die that includes a Hall effect sensor 112 formed thereon. The Hall effect sensor 112 is a horizontal Hall effect sensor. The integrated circuit 106 is disposed between the isolation spacer 104 and the magnetic concentrator 108 and magnetic concentrator 110. In some implementations, the integrated circuit 106 has a thickness of about 150-250 um. The integrated circuit 106 is coupled to the lead frame 102 by bond wires 114 for transfer of electrical signals between the lead frame 102 and the integrated circuit 106.

The magnetic concentrator 108 is aligned with and overlaps the current output leg/segment 103B to concentrate magnetic flux produced by current flow in the current output leg/segment 103B. Similarly, the magnetic concentrator 110 is aligned with and overlaps the current input leg/segment 103A to concentrate magnetic flux produced by current flow in the current input leg/segment 103A. The magnetic flux about the magnetic concentrator 108 and the magnetic concentrator 110 is proportional to the current flowing in the current input leg/segment 103A and the current output leg/segment 103B. In some implementations of the 100, the magnetic concentrators 108 and 110 are formed/deposited on the integrated circuit 106 by electroplating as part of wafer-level processing. Thus, the alignment of the magnetic concentrators 108 and 110 and the Hall effect sensor 112 is precisely controlled. The magnetic concentrators 108 and 110 may be formed of soft magnetic material such as iron-nickel alloy.

The Hall effect sensor 112 is disposed between the magnetic concentrator 108 and the magnetic concentrator 110 and overlaps a portion of both the magnetic concentrator 108 and magnetic concentrator 110. For example, the Hall effect sensor 112 overlaps an edge 108A of the magnetic concentrator 108 and an edge 110A of the magnetic concentrator 110. The Hall effect sensor 112 detects the magnetic flux about the magnetic concentrator 108 and the magnetic concentrator 110, and based on the detected magnetic flux generates an output voltage proportional to the current flowing in the current input leg/segment 103A and the current output leg/segment 1036.

Figure 2:
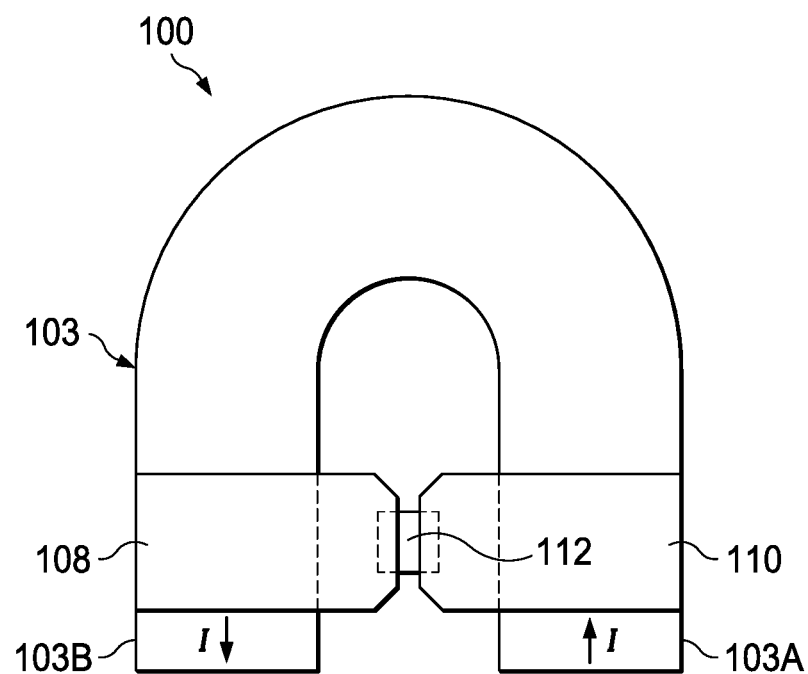
FIG. 2 shows a top view of a current sensor that includes a Hall effect sensor overlapping two magnetic concentrators.

FIG. 2 shows a top view of the current sensor 100. The conductor 103, the magnetic concentrator 108, the magnetic concentrator 110, and the Hall effect sensor 112 are shown in FIG. 2. As shown in FIG. 2, the conductor 103 is "U-shaped" or "horse-shoe-shaped." In various implementations of the current sensor 100, the conductor 103 may have any shape. The magnetic concentrator 108 overlaps the current output leg/segment 103B and the Hall effect sensor 112, and the magnetic concentrator 110 overlaps the current input leg/segment 103A and the Hall effect sensor 112.

Figure 3:
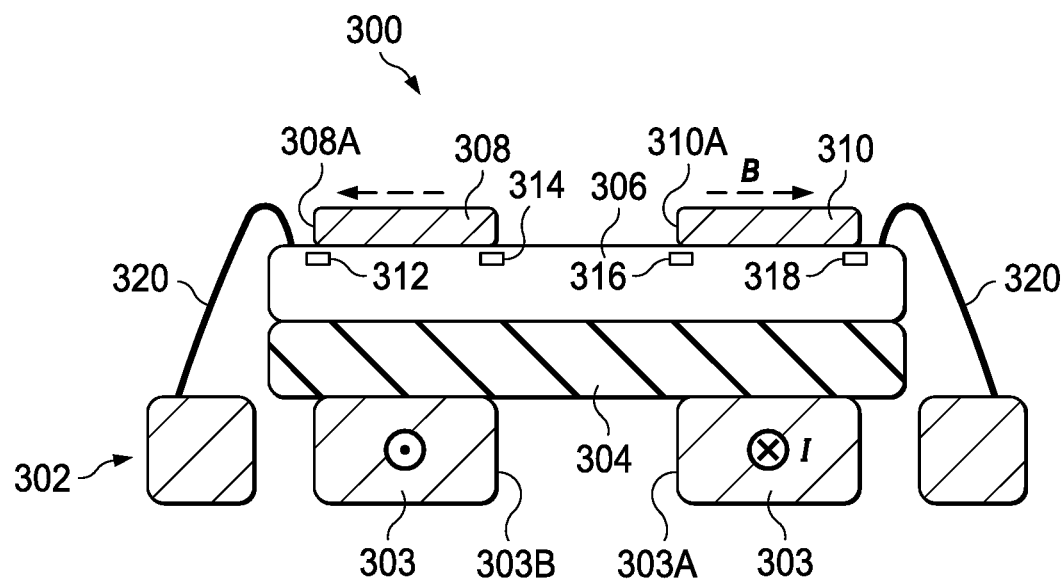
FIG. 3 shows a side view of a current sensor that includes four Hall effect sensors overlapping two magnetic concentrators.

FIG. 3 shows a side view of a current sensor 300 in accordance with this description. The current sensor 300 includes a lead frame 302, an isolation spacer 304, an integrated circuit 306, a magnetic concentrator 308, and a magnetic concentrator 310. The lead frame 302 includes a conductor 303 that carries a current to be measured. The conductor 303 includes a current input leg/segment 303A through which current flows in to the current sensor 300 and a current output leg/segment 303B through which current flows out of the current sensor 300. The isolation spacer 304 is disposed between the lead frame 302 and the integrated circuit 306 to isolate the integrated circuit 306 from high voltages that may be present on the conductor 303. The isolation spacer 304 is formed of material having high dielectric strength, such as glass dielectric materials, polymer-based dielectric materials, or silicon-based dielectric materials. In some implementations, the isolation spacer 304 has a thickness of about 100-150 micrometers (um).

The integrated circuit 306 is a silicon die that includes, formed thereon, a Hall effect sensor 312, a Hall effect sensor 314, a Hall effect sensor 316, and a Hall effect sensor 318. The Hall effect sensor 312, the Hall effect sensor 314, the Hall effect sensor 316, and the Hall effect sensor 318 are horizontal Hall effect sensors. The integrated circuit 306 is disposed between the isolation spacer 304 and the magnetic concentrator 308 and magnetic concentrator 310. In some implementations, the integrated circuit 306 has a thickness of about 150-250 um. The integrated circuit 306 is coupled to the lead frame 302 by bond wires 320 for transfer of electrical signals between the lead frame 302 and the integrated circuit 306.

The magnetic concentrator 308 is aligned with and overlaps the current output leg/segment 303B to concentrate magnetic flux produced by current flow in the current output leg/segment 303B. Similarly, the magnetic concentrator 310 is aligned with and overlaps the current input leg/segment 303A to concentrate magnetic flux produced by current flow in the current input leg/segment 303A. The magnetic flux about the magnetic concentrator 308 and the magnetic concentrator 310 is proportional to the current flowing in the current input leg/segment 303A and the current output leg/segment 303B. The magnetic concentrator 308 and the magnetic concentrator 310 may be provided in the form of a circular magnetic disk, an octagonal magnetic disk, an elliptical magnetic disk, a polygonal magnetic disk, etc. of soft magnetic material such as iron-nickel alloy. In some implementations of the 300, the magnetic concentrators 308 and 310 are formed/deposited on the integrated circuit 306 by electroplating as part of wafer-level processing. Thus, the alignment of the magnetic concentrators 308 and 310 and the Hall effect sensors 312-318 is precisely controlled.

The Hall effect sensor 312 is disposed to overlap an edge 308A of the magnetic concentrator 308. The Hall effect sensor 314 is disposed to overlap the edge of the magnetic concentrator 308 opposite the Hall effect sensor 312. The Hall effect sensor 312 and the Hall effect sensor 314 detect the magnetic flux about the magnetic concentrator 308, and based on the detected magnetic flux generate output voltages proportional to the current flowing in the current output leg/segment 303B.

The Hall effect sensor 316 is disposed to overlap an edge 310A of the magnetic concentrator 310. The Hall effect sensor 318 is disposed to overlap the edge of the magnetic concentrator 310 opposite the Hall effect sensor 316. The Hall effect sensor 316 and the Hall effect sensor 318 detect the magnetic flux about the magnetic concentrator 310, and based on the detected magnetic flux generate output voltages proportional to the current flowing in the current input leg/segment 303A.

Figure 4:
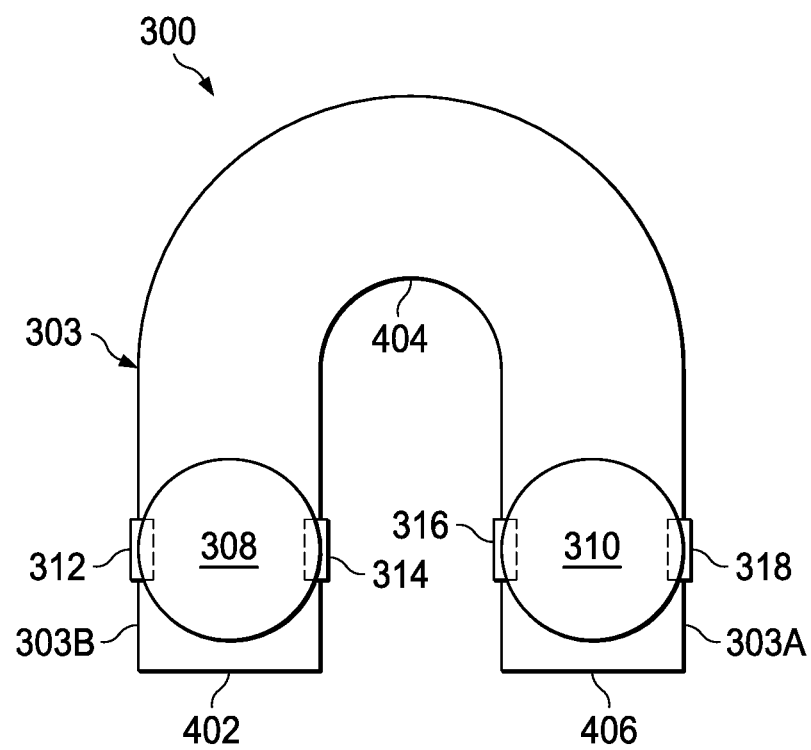
FIG. 4 shows a top view of a current sensor that includes four Hall effect sensors overlapping two magnetic concentrators.

FIG. 4 shows a top view of the current sensor 300. The conductor 303, the magnetic concentrator 308, the magnetic concentrator 310, the Hall effect sensor 312, the Hall effect sensor 314, the Hall effect sensor 316, and the Hall effect sensor 318 are shown in FIG. 4. As shown in FIG. 4, the conductor 303 is "U-shaped." The magnetic concentrator 308 overlaps the current output leg/segment 303B, the Hall effect sensor 312, and the Hall effect sensor 314. The magnetic concentrator 310 overlaps the current input leg/segment 303A, the Hall effect sensor 316, and the Hall effect sensor 318.

The magnetic concentrator 308 is disposed to overlap a linear section of the current output leg/segment 303B. For example, the magnetic concentrator 308 is closer to an end 402 of the current input leg/segment 303B than to an apex 404 of the conductor 303. The magnetic concentrator 310 is disposed to overlay a linear section of the current input leg/segment 303A. For example, the magnetic concentrator 310 is closer to an end 406 of the current input leg/segment 303A than to the apex 404 of the conductor 303. The positioning of the magnetic concentrator 308 and the magnetic concentrator 310 aids in cancellation of error due to stray magnetic fields.

Figure 5:
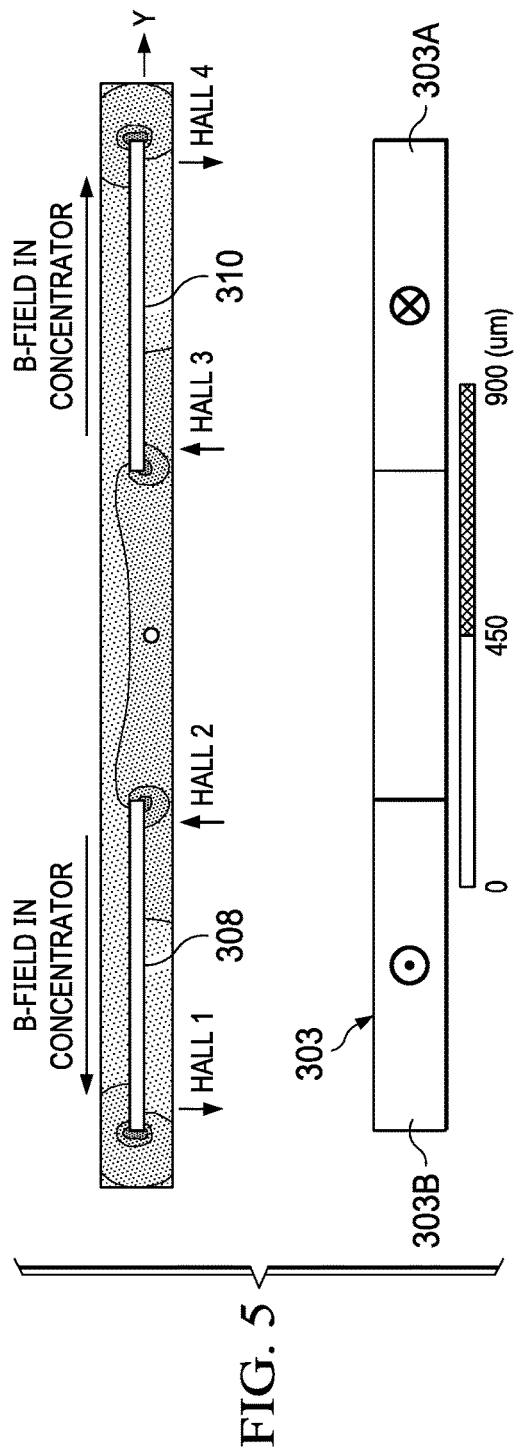
FIG. 5 shows magnetic fields in the magnetic concentrators of FIG. 3 with no stray magnetic field.

FIG. 5 shows magnetic fields in the magnetic concentrators 308 and 310 with no stray magnetic field present. Given the magnetic fields, summation circuitry provided on the integrated circuit 306 sums the output of the Hall effect sensors 312-318 as:

$$V_{out} = -V_{Hall1} + V_{Hall2} + V_{Hall3} - V_{Hall4}$$

where:
$V_{out}$ is the output of the summation circuitry and is proportional to the current flowing in the current input leg/segment 303A and the current output leg/segment 303B;
$V_{Hall1}$ is the output of the Hall effect sensor 312;
$V_{Hall2}$ is the output of the Hall effect sensor 314;
$V_{Hall3}$ is the output of the Hall effect sensor 316; and
$V_{Hall4}$ is the output of the Hall effect sensor 318.

Figure 6:
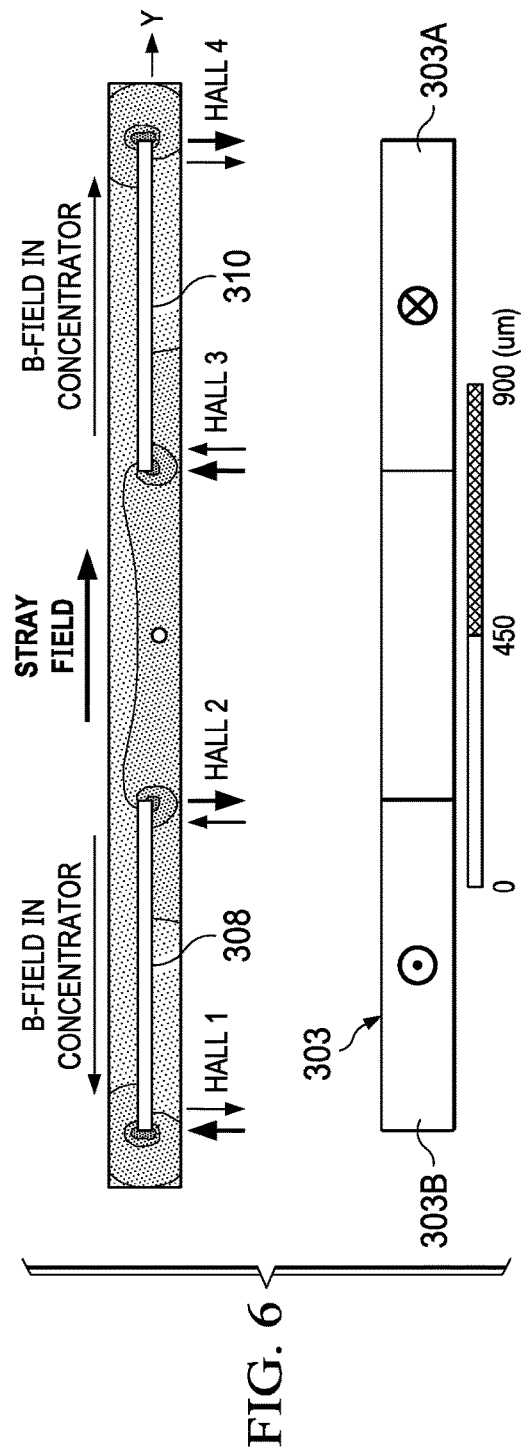
FIG. 6 shows magnetic fields in the magnetic concentrators of FIG. 3 with a stray magnetic field.

FIG. 6 shows magnetic fields in the magnetic concentrators 308 and 310 with a stray magnetic field present.

$$V_{out} = -(V_{Hall1} + V_{stray}) + (V_{Hall2} - V_{stray}) + (V_{Hall3} + V_{stray}) - (V_{Hall4} - V_{stray})$$

where $V_{stray}$ is the voltage induced in the Hall effect sensors 312-318 by the stray magnetic field.

The current flowing in the conductor 303 generates an opposing in-plane magnetic field about the magnetic concentrator 308 and the magnetic concentrator 310. The Hall effect sensors 312-318 measure the opposing magnetic fields to produce output voltages. Summation of the outputs of the Hall effect sensors 312-318 cancels the voltage due to the stray magnetic field. Thus, implementations of the current sensor 300 are not subject to current measurement errors caused by stray magnetic fields.

Figure 7:
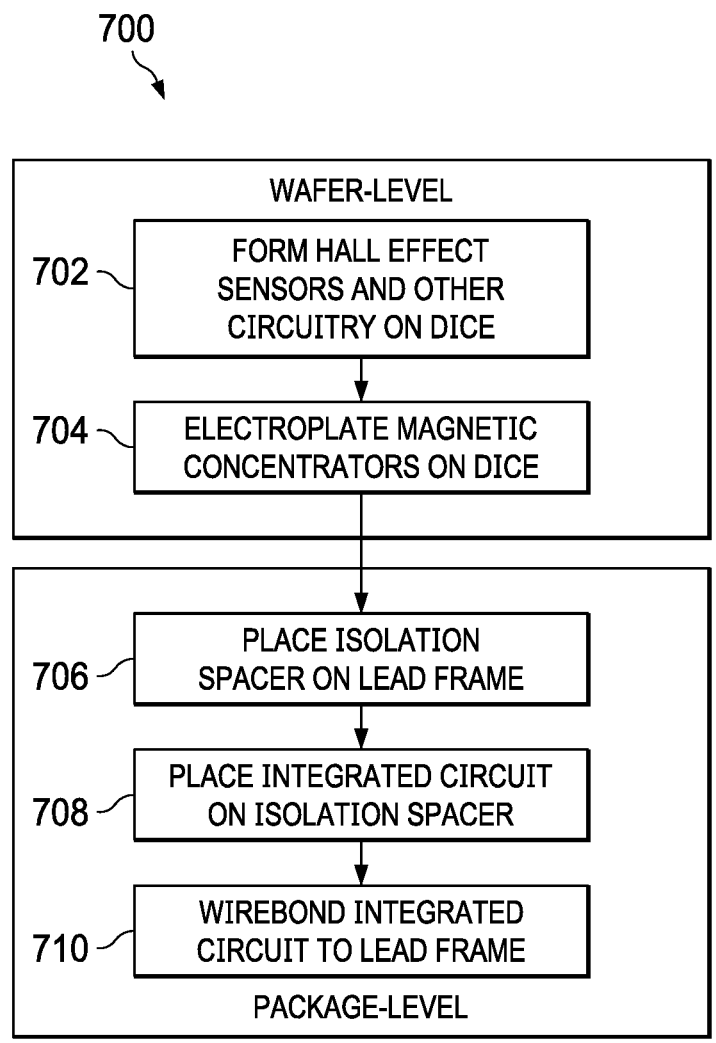
FIG. 7 shows a flow diagram for a method for fabricating a current sensor in accordance with this description.

FIG. 7 shows a flow diagram for a method 700 for fabricating a current sensor in accordance with this description. Though depicted sequentially as a matter of convenience, at least some of the actions shown can be performed in a different order and/or performed in parallel. Also, some implementations may perform only some of the actions shown. In the method 700, the operations of blocks 702 and 704 are performed during wafer-level processing, and the operations of blocks 706-710 are performed during package-level processing.

In block 702, the electrical circuitry is formed on the integrated circuit 306. Accordingly, circuitry is formed on dies of a wafer, where the dies correspond to instances of the integrated circuit 106. The electrical circuitry formed on the dies includes the Hall effect sensors 312-318 and summation circuitry that processes the outputs of the Hall effect sensors 312-318.

In block 704, the magnetic concentrators 308 and 310 are formed on the integrated circuit 106. Accordingly, an instance of the magnetic concentrators 308 and 310 is formed on each instance of the integrated circuit 106 provided on the wafer. The magnetic concentrators 308 and 310 are electroplated on a surface of each die as one or more layers of magnetic material. Because the location of the magnetic concentrators 308 and 310 is established via masking at the wafer-level, the alignment of the magnetic concentrators 308 and 310 with the Hall effect sensors 312-318 can be precisely controlled to improve communication of magnetic fields between the magnetic concentrators 308 and 310 and the Hall effect sensors 312-318.

After singulation, the integrated circuit 106 is packaged in blocks 706-710. In block 706, the isolation spacer 304 is placed on the lead frame 302. For example, the isolation spacer 304 may be bonded to the lead frame 302 using epoxy or other adhesive. In some implementations of the method 700, the isolation spacer 300 is bonded to the wafer before, rather than after, singulation In block 708, the integrated circuit 306 is placed on the isolation spacer 304. For example, the integrated circuit 306 may be bonded to the isolation spacer 304 using epoxy or other adhesive.

In block 710, the bond wires 320 are added to electrically couple the integrated circuit 306 to the lead frame 302. An encapsulation compound may be applied to protect the lead frame 302 (or a portion thereof), the isolation spacer 304, and the integrated circuit 306.

In this description, the term "couple" may cover connections, communications, or signal paths that enable a functional relationship consistent with this description. For example, if device A generates a signal to control device B to perform an action, then: in a first example, device A is coupled to device B; or in a second example, device A is coupled to device B through intervening component C if intervening component C does not substantially alter the functional relationship between device A and device B, such that device B is controlled by device A via the control signal generated by device A.

Modifications are possible in the described embodiments, and other embodiments are possible, within the scope of the claims.

What is claimed is:

1. A packaged current sensor, comprising:
   a lead frame comprising a conductor;
   an integrated circuit;
   a dielectric material between the lead frame and the integrated circuit; and
   a magnetic concentrator that overlaps the conductor.

2. The packaged current sensor of claim 1, wherein the integrated circuit includes a Hall effect sensor, and the Hall effect sensor overlaps the magnetic concentrator.

3. The packaged current sensor of claim 2, wherein:
   the magnetic concentrator is a first magnetic concentrator;
   the packaged current sensor includes a second magnetic concentrator; and
   the Hall effect sensor overlaps a space between the first magnetic concentrator and the second magnetic concentrator.

4. The packaged current sensor of claim 3, wherein the Hall effect sensor overlaps a respective first edge of the first magnetic concentrator and second edge of the second magnetic concentrator.

5. The packaged current sensor of claim 2, wherein the Hall effect sensor is aligned with the magnetic concentrator.

6. The packaged current sensor of claim 3, wherein:
   the conductor comprises a first linear segment, a second linear segment, and a bent segment electrically coupled between the first and second linear segments;
   the first magnetic concentrator overlaps the first linear segment;
   the second magnetic concentrator overlaps the second linear segment;
   the Hall effect sensor is configured to generate a first signal based on a first magnetic flux at the first magnetic concentrator and a second magnetic flux at the second magnetic concentrator; and
   the integrated circuit is configured to generate a second signal representing a current in the conductor based on the first signal.

7. The packaged current sensor of claim 1 wherein the integrated circuit comprises:
   a first Hall effect sensor that overlaps a first edge of the magnetic concentrator; and
   a second Hall effect sensor that overlaps a second edge of the magnetic concentrator opposite the first edge.

8. The packaged current sensor of claim 7, wherein:
   the magnetic concentrator is a first magnetic concentrator;
   the packaged current sensor comprises a second magnetic concentrator; and
   the integrated circuit comprises:
     a third Hall effect sensor that overlaps a third edge of the second magnetic concentrator; and
     a fourth Hall effect sensor that overlaps a fourth edge of the second magnetic concentrator opposite the third edge.

9. The packaged current sensor of claim 8, wherein:
   the conductor comprises:
     a current input leg; and
     a current output leg; and
   the first magnetic concentrator overlaps the current input leg; and the second magnetic concentrator overlaps the current output leg.

10. The packaged current sensor of claim 9, wherein the first magnetic concentrator is aligned with the current input leg, and the second magnetic concentrator is aligned with the current output leg.

11. The packaged current sensor of claim 8, wherein the first magnetic concentrator and the second magnetic concentrator are electroplated onto the integrated circuit.

12. The packaged current sensor of claim 7, wherein the first Hall effect sensor is aligned with the first edge, and the second Hall effect sensor is aligned with the second edge.

13. The packaged current sensor of claim 8, wherein the third Hall effect sensor is aligned with the third edge, and the fourth Hall effect sensor is aligned with the fourth edge.

14. The packaged current sensor of claim 1, wherein the magnetic concentrator includes a circular disk of soft magnetic material or a polygonal disk of soft magnetic material.

15. The packaged current sensor of claim 1, wherein the magnetic concentrator is aligned with the conductor.

16. A current sensor, comprising:
a lead frame comprising a conductor, the conductor including a current input segment, a current output segment, and a bent segment electrically coupled between the current input and output segments;
an integrated circuit comprising a Hall effect sensor;
an isolation spacer between the lead frame and the integrated circuit;
a first magnetic concentrator that overlaps the current input segment; and
a second magnetic concentrator that overlaps the current output segment.

17. The current sensor of claim 16, wherein the second magnetic concentrator overlaps the Hall effect sensor.

18. The current sensor of claim 16, wherein:
the Hall effect sensor is a first Hall effect sensor that overlaps a first edge of the first magnetic concentrator; and
the integrated circuit includes a second Hall effect sensor that overlaps a second edge of the first magnetic concentrator opposite the first edge.

19. The current sensor of claim 18, wherein:
the integrated circuit includes a third Hall effect sensor that overlaps a third edge of the second magnetic concentrator.

20. The current sensor of claim 19, wherein:
the integrated circuit includes a fourth Hall effect sensor that overlaps a fourth edge of the second magnetic concentrator opposite the third edge.

21. The current sensor of claim 20, wherein the integrated circuit includes a summation circuit having a first input, a second input, a third input, a fourth input, and a measurement output, the first input coupled to a first output of the first Hall effect sensor, the second input coupled to a second output of the second Hall effect sensor, the third input coupled to a third output of the third Hall effect sensor, and the fourth input coupled to a fourth output of the fourth Hall effect sensor, the summation circuit is configured to:
receive a first signal via the first input;
receive a second signal via the second input;
receive a third signal via the third input;
receive a fourth signal via the fourth input;
generate a fifth signal representing a measurement of a current in the conductor, the fifth signal generated based on: (a) a first difference between the first and second signals; and (b) a second difference between the third and fourth signals; and
provide the fifth signal at the measurement output.

22. The current sensor of claim 16, wherein each of the first magnetic concentrator and the second magnetic concentrator includes a circular disk of soft magnetic material.

23. The current sensor of claim 16, wherein each of the first magnetic concentrator and the second magnetic concentrator includes a polygonal disk of soft magnetic material.

24. The current sensor of claim 16, wherein the first magnetic concentrator is aligned with the current input segment, and the second magnetic concentrator is aligned with the current output segment.

25. The current sensor of claim 16, wherein the first magnetic concentrator is aligned.

26. The current sensor of claim 16, wherein the isolation spacer includes a dielectric material.

27. A current sensor, comprising:
a lead frame comprising a conductor, the conductor including a current input segment, a current output segment, and a bent segment electrically coupled between the current input and output segments;
an integrated circuit including a first Hall effect sensor, a second Hall effect sensor, a third Hall effect sensor, and a fourth Hall effect sensor;
an isolation spacer between the lead frame and the integrated circuit; and
a first magnetic concentrator and a second magnetic concentrator on the integrated circuit, the first magnetic concentrator overlapping the current input segment, the first Hall effect sensor, and the second Hall effect sensor, and the second magnetic concentrator overlapping the current output segment, the third Hall effect sensor, and the fourth Hall effect sensor.

28. The current sensor of claim 27, wherein:
the first Hall effect sensor overlaps a first edge of the first magnetic concentrator; and
the second Hall effect sensor overlaps a second edge of the first magnetic concentrator opposite the first edge.

29. The current sensor of claim 27, wherein:
the third Hall effect sensor overlaps a first edge of the second magnetic concentrator; and
the fourth Hall effect sensor overlaps a second edge of the second magnetic concentrator opposite the first edge.

30. The current sensor of claim 27, wherein each of the first magnetic concentrator and the second magnetic concentrator includes a circular magnetic disk or a polygonal magnetic disk.

31. The current sensor of claim 27, wherein the isolation spacer includes a dielectric material.

32. The current sensor of claim 27, wherein the integrated circuit includes a summation circuit having a first input, a second input, a third input, a fourth input, and a measurement output, the first input coupled to a first output of the first Hall effect sensor, the second input coupled to a second output of the second Hall effect sensor, the third input coupled to a third output of the third Hall effect sensor, and the fourth input coupled to a fourth output of the fourth Hall effect sensor, the summation circuit is configured to:
receive a first signal via the first input;
receive a second signal via the second input;
receive a third signal via the third input;
receive a fourth signal via the fourth input;
generate a fifth signal representing a measurement of a current in the conductor, the fifth signal generated based on: (a) a first difference between the first and second signals; and (b) a second difference between the third and fourth signals; and
provide the fifth signal at the measurement output.

* * * * *